United States Patent [19]
Dvoracek

[11] 3,955,157
[45] May 4, 1976

[54] WAVE GUIDE PULSE GENERATOR PRODUCING NARROW WIDTH PULSE

[75] Inventor: Leonard J. Dvoracek, Burlington, N.C.

[73] Assignee: Western Electric Company, Inc., New York, N.Y.

[22] Filed: Jan. 23, 1975

[21] Appl. No.: 543,601

[52] U.S. Cl. ............................ 333/20; 328/58; 333/10
[51] Int. Cl.[2] .................. H01P 1/00; H03H 7/14
[58] Field of Search ............... 333/20; 328/53, 56, 328/58, 61, 65

[56] References Cited
UNITED STATES PATENTS

| | | | |
|---|---|---|---|
| 2,413,181 | 12/1946 | Hergenrother | 328/58 X |
| 2,930,004 | 3/1960 | Coale | 333/20 X |

FOREIGN PATENTS OR APPLICATIONS

| | | | |
|---|---|---|---|
| 890,846 | 3/1962 | United Kingdom | 328/58 |

Primary Examiner—Paul L. Gensler
Attorney, Agent, or Firm—J. B. Hoofnagle, Jr.

[57] ABSTRACT

A high energy pulse having a very narrow pulse width is generated utilizing a wave guide pulse generator. A first pulse having a pulse width greater than the desired pulse is modified to have a well-defined leading edge and is then coupled to a first quadrature hybrid. A second pulse, shifted in phase relative to the modified first pulse, is generated in the first hybrid from, and in addition to, the modified first pulse. The phase-shifted second pulse travels the length of a conventional wave guide so that the pulse is delayed before entering a second quadrature hybrid. The second quadrature hybrid receives the modified first and phase-shifted second pulses andd phase shifts the second pulse so that the phase thereof is opposed to the phase of the modified first pulse. The modified first pulse is then combined with the opposed phase-shifted second pulse. Upon combining the opposed, phase-shifted, delayed second pulse with the modified first pulse, a major portion of the modified first pulse is cancelled and an output pulse is developed having a pulse width equal to the delay caused by the conventional wave guide.

11 Claims, 3 Drawing Figures

3,955,157

WAVE GUIDE PULSE GENERATOR PRODUCING NARROW WIDTH PULSE

BACKGROUND OF THE INVENTION

1. Field of the Invention

This invention relates to a pulse generator and more particularly to a pulse generator formed of wave guide circuit elements which facilitates the generation of high powered RF pulses having narrow pulse widths.

2. Discussion of the Prior Art

In the design and construction of generators for producing pulses of very narrow widths in relatively low power ranges, readily available standard components can be used. Such components generally have limited power handling capacity which is satisfactory for pulse generators in the low power ranges.

When designing and constructing a generator for producing pulses, or bursts of energy, of short duration, for example in the nanosecond range, and in the power range of hectorwatts or kilowatts, the components for such a generator must have high power handling capacity. Normally, such high power handling components are not readily available and are expensive. Thus, the construction of high power pulse generators has heretofore been a relatively costly effort.

SUMMARY OF THE INVENTION

It is, therefore, an object of this invention to provide a new and improved pulse generator.

Another object of this invention is to provide a short rise time high powered RF pulse generator having extremely large power capabilities.

Still another object of this invention is to provide a high powered pulse generator capable of producing RF pulses having very narrow pulse widths.

A further object of this invention is to provide a pulse generator capable of generating high powered narrow pulses without the attendant expense of having to use the high powered circuit components, whose powered capacities dictate higher cost.

A pulse generator in accordance with this invention, which generates narrow, high powered pulses, includes: (1) means for generating a first pulse having a pulse width greater than the desired output pulse width, (2) means for modifying the first pulse to provide a leading edge of prescribed definition, (3) wave guide means for generating a second pulse in response to the modified first pulse, the second pulse having a leading edge formed with the prescribed definition and being shifted in phase to oppose the phase of the modified first pulse, (4) delay means for delaying the phase-shifted second pulse, and (5) means for combining the modified first pulse and the delayed phase-shifted second pulse so that upon the combination an output pulse is developed having a pulse width equal to the delay caused by the delay means.

BRIEF DESCRIPTION OF THE DRAWINGS

Other objects and advantages of the present invention will be apparent from the following detailed description when considered in conjunction with the accompanying drawings in which.

DETAILED DESCRIPTION

Figure 1:
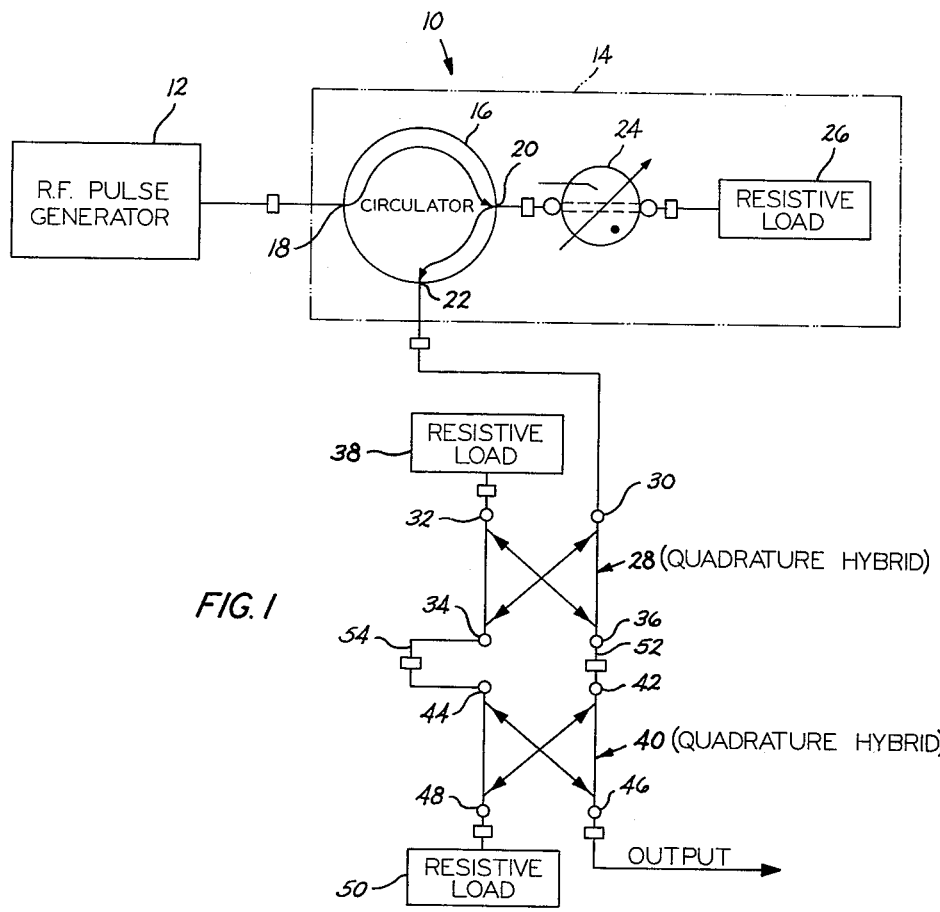
FIG. 1 is a diagram showing a pulse generator embodying certain principles of the invention.

Referring to FIG. 1, a wave guide pulse generator circuit, designated generally by the numeral 10, includes a RF pulse generator 12 such as a magnetron or a high powered microwave generator, and a modifying circuit, designated generally by the numeral 14, for receiving and modifying a signal generated by the generator 12.

The modifying circuit 14 includes a three-port circulator 16, having signal ports 18, 20, and 22, and a gas tube 24 which is coupled to port 20 of the circulator. The circulator 16 can be, for example, of the type referred to as model number MA8K212 available from Microwave Associates of Burlington, Massachusetts. The modifying circuit 14 is coupled to receive bursts of energy referred to herein as pulses from the generator 12 at the port 18 of the circulator 16. The gas tube 24 is terminated by a load 26. The gas tube 24 can be a transmit-receive tube, a spark-gap tube, or any other similar tube. An example of a suitable gas tube is that referred to as model number 6164 available from Microwave Associates of Burlington, Massachusetts.

A first wave guide quadrature hybrid designated generally by the numeral 28, having input ports 30 and 32, only one of which is used for purposes of this invention, and output ports 34 and 36, is coupled at input port 30 to the port 22 of the circulator 16, to receive a modified pulse therefrom. The input port 32 of the quadrature hybrid 28 is terminated by a load 38 to insure that the quadrature hybrid will operate properly while only one input port is being utilized.

The instrinsic characteristics of a wave guide quadrature hybrid are such that when a pulse is applied to either input port thereof, the pulse will be divided to create two pulses, one at each of two output ports in response to the pulse applied to the input. Still further in such a wave guide hybrid, a quadrature phase shift is developed between the two pulses that appear at the two output ports, i.e., the phase of the pulse which appears on one output lags by 90° the phase of the pulse which appears at the other output. Thus, the nature of the quadrature hybrid is such that, when a pulse is applied to one of its input ports, the energy of that pulse will be split thereby resulting in two pulses appearing at the output ports. It should be noted that other wave guide elements displaying characteristics similar to those of the quadrature hybrid may be utilized without departing from the spirit and scope of this invention.

Thus, the first quadrature hybrid 28, provides pulses at each of the output ports 34 and 36 in response to a pulse applied to the input port 30 thereof with one output pulse being shifted 90° in phase from the input pulse.

A second wave guide quadrature hybrid, designated generally by the numeral 40, is formed with input ports 42 and 44 which are coupled to output ports 36 and 34 of the first quadrature hybrid 28 via wave guides 52 and 54, respectively. The second quadrature hybrid 40 is also formed with output ports 46 and 48. It is noted that the pulse which will appear at the output port 48 will not be used in generating a desired output pulse; accordingly, the pulse appearing at output port 48 should be properly terminated in a load 50.

The wave guide 54, which couples the output port 34 of the first quadrature hybrid 28, to the input port 44 of the second quadrature hybrid 40, is of greater length than the corresponding wave guide 52, which couples the output port 36 of the first quadrature hybrid 28 to the input port 42 of the second quadrature hybrid 40. With the relative lengths of the wave guides 52 and 54 as such, a pulse generated at the output port 34 of the first quadrature hybrid 28 will reach the output port 46 of the second quadrature hybrid 40 after a pulse which has been generated at the output 36 of the first quadrature hybrid.

Ideally, the length of the wave guide 52 should be zero and the length of the wave guide 54 slightly longer depending on the output pulse width desired. However, since a wave guide of zero length cannot be physically achieved in this application, an output pulse in accordance with this invention can be generated if the length of the guide 54 is such that the phase shift of the pulse appearing at the output port 34 of the first quadrature hybrid 28 is maintained at 90° when the pulse reaches the quadrature hybrid 40 and if the length of the wave guide 54 is greater than that of the wave guide 52. Since the pulse widths to be generated are in the range of nanoseconds, these requirements are easily met.

Figure 2:
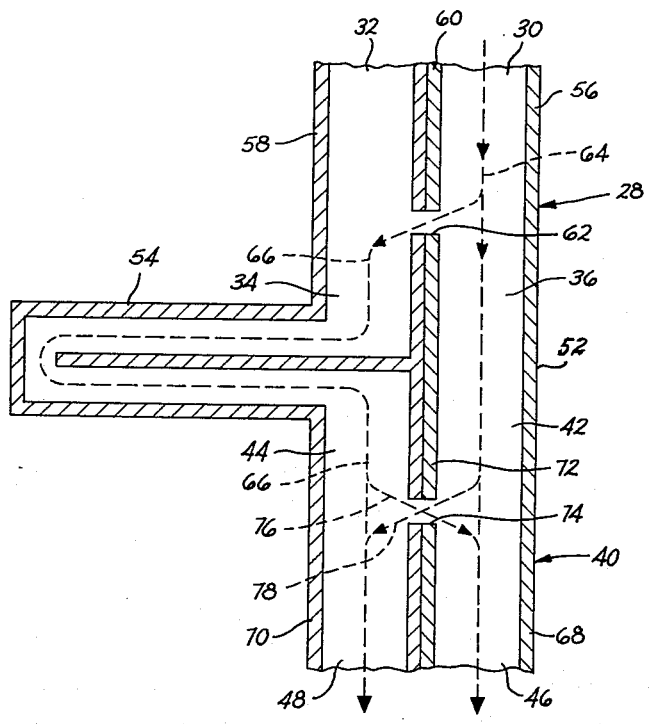
FIG. 2 is a sectional view showing a portion of the pulse generator of FIG. 1.

The wave guide structure including the quadrature hybrids 28 and 40 and the corresponding wave guides 52 and 54 can be structured as shown in FIG. 2. The first quadrature hybrid 28 is formed of conventional wave guides 56 and 58 having a common wall 60 therebetween. Located at an intermediate portion of the common wall 60 is an opening or slot 62 which, in conjunction with the other wave guide structure, allows a pulse introduced at the input port 30 of the first quadrature hybrid 28 to be split to form two pulses that travel in the respective sections of the quadrature hybrid as is indicated by the dotted lines 64 and 66. Similarly, the second quadrature hybrid 40 is formed of two wave guides 68 and 70 having a common wall 72 therebetween and an opening or slot 74 located on an intermediate portion of the common wall 72. It is noted that the embodiment shown of the wave guide structure of this invention shown in FIG. 2 is by way of illustration. Accordingly, it should be apparent that the structure can be made in other configurations and still be within the scope of this invention.

The wave guides 52 and 54 located between the quadrature hybrids 28 and 40 join the output ports 34 and 36 of the first quadrature hybrid 28 to the input ports 44 and 42, respectively, of the second quadrature hybrid 40. Thus, pulses developed in the first quadrature hybrid 28 can be coupled to the second quadrature hybrid 40 and split therein as is indicated by the dotted lines 76 and 78.

Figure 3:
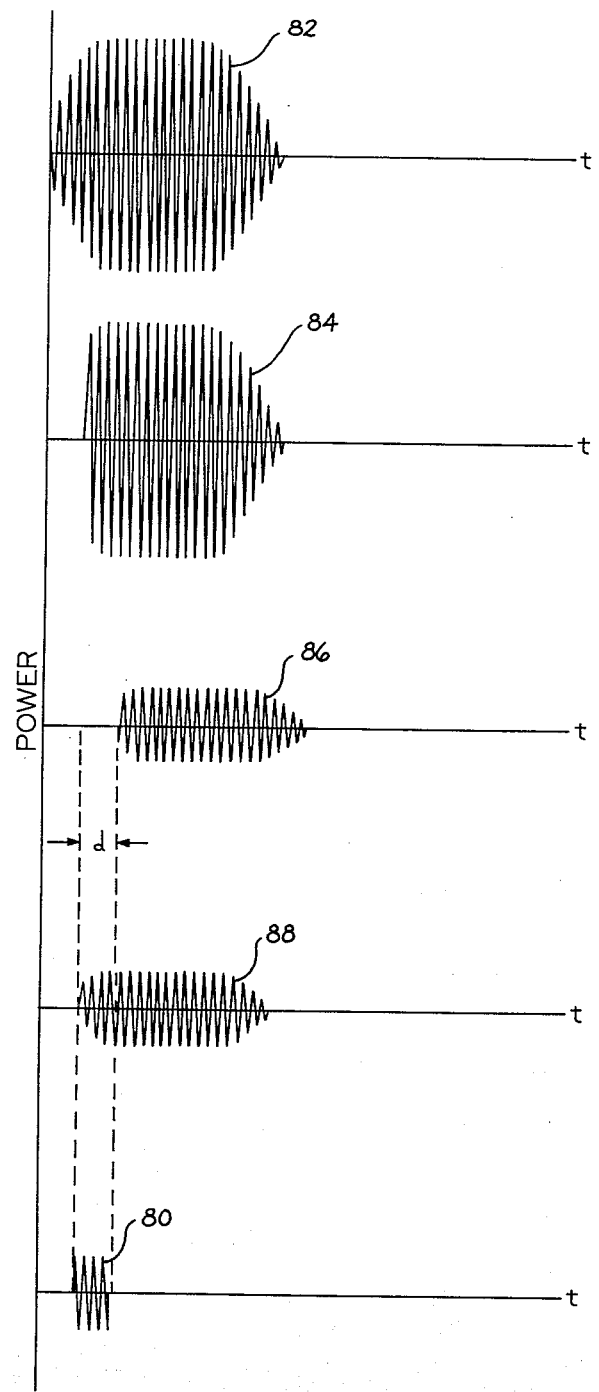
FIG. 3 is a diagram showing the pulses developed at various points in the generator of FIG. 1.

As illustrated in FIG. 3 and in accordance with this invention, the pulse generator circuit 10 produces a desired high powered narrow output pulse 80, representing a high frequency carrier within an envelope. The desired output pulse 80 is produced by initially providing a high frequency, high powered burst of energy within an envelope represented by an input pulse 82 which is generated by the pulse generator 12 and having a pulse width greater than the width of the desired output pulse. A factor in generating the output pulse 80 in accordance with this invention is the providing of an initial pulse having leading and trailing edges of a prescribed definition, i.e., a very fast rise time (ideally zero) and a very slow fall time. The desired trailing edge characteristic is a function of the generator 12 and can ordinarily be about 100 nanoseconds. However, the leading edge characteristics must be achieved through operation of the modifying circuit 14. Accordingly, the input pulse 82, produced by the generator 12, is fed to the modifying circuit 14 where it is applied to the port 18 of the circulator 16, and passes from the port 20. The input pulse 82 is then applied to the gas tube 24 and terminates in the load 26. As the input pulse 82 reaches a predetermined amplitude, that is an amplitude sufficient to cause ionization of the gas tube 24, the gas tube will effectively short the port 20 of the circulator 16, thereby modifying the input pulse and creating a new or modified input pulse 84 which is reflected back into the circulator. Because of the nature of the circulator 16, the modified input pulse 84 is transferred to the circulator port 22. The modified input pulse 84 appearing at port 22 of the circulator 16 has a rise time of essentially zero, i.e., about two nanoseconds. As such, the effect the leading edge of the modified input pulse 84 has in establishing the very narrow pulse width of the desired output pulse 80 is significantly minimized.

The modified input pulse 84 is then applied to the input port 30 of the first quadrature hybrid 28 where a second pulse (not shown), reduced in amplitude by a factor of two, is formed which is shifted in phase 90° relative to the modified input pulse 84 and which appears at the output port 34 of the first hybrid. The modified input pulse 84 is coupled through the first hybrid 28 and appears at the output port 36 reduced in amplitude by a factor of two. The phase-shifted pulse at output port 34 and the modified input pulse 84 at output port 36 are then applied through wave guides 54 and 52, respectively, to the second quadrature hybrid 40.

The phase-shifted pulse passing through the wave guide 54 is applied to the input port 44 of the second quadrature hybrid 40. The modified input pulse 84 is applied to the input port 42 of the second quadrature hybrid 40. The phase-shifted pulse which is applied to the input 44 will split causing a pulse 86 to appear in the wave guide 68 (FIG. 2) of the quadrature hybrid 40. The pulse 86 will have shifted an additional 90° by virtue of passing through the slot 74 and into the wave guide 68. Therefore, after passing through the slot 74, the pulse 86 will be shifted in phase 180° and will have been delayed by an amount $d$ (FIG. 3) by virtue of the phase-shifted pulse at output port 34 traveling the length of the wave guide 54. A pulse 88 is developed in wave guide 68 by virtue of the splitting of the modified input pulse 84 at the slot 74 of the quadrature hybrid 40. It is noted that the pulse 88 is an attenuated version of and in phase with the modified input pulse 84. The pulse 86, which is 180° out of phase with the pulse 88 will be combined with the pulse 88 in the wave guide 68. However, because the wave guide 54 is longer than the wave guide 52, the pulse 86 which is developed from the phase-shifted pulse, is delayed with respect to the pulse 88. Therefore, during the time the pulse 86 is delayed, the combining of the pulses 86 and 88 in the wave guide 68 will be delayed by the amount of the delay time developed by the wave guide 54 and the leading portion of the pulse 88 will appear at the output port 46 until the combination occurs. Because of the phase difference of 180° between the two pulses 86 and 88 the combining of the two pulses in the wave guide 68 results in the cancellation of the pulse 86 and the remaining portion of the pulse 88 thereby developing an output of essentially zero when the two pulses are combined. As a result the desired output pulse 80, having a pulse width essentially equal to the time delay created by the wave guide 54, will be developed at the output port 46 of the quadrature hybrid 40.

Still further, since the trailing edge of the modified input pulse 84 is as described herein, the presence of other pulses in the output of the generator circuit 10 is virtually eliminated. Thus, the shape of the leading edge of the modified input pulse 84 controls the shape of the leading and trailing edge of the desired output pulse 80. It should be apparent that because the pulse 82 is modified to develop the modified input pulse 84 having a prescribed definition, i.e., essentially zero rise time, the effect the leading edges of the pulses 86 and 88 have in establishing the pulse width of the output pulse 80 is significantly minimized.

What is claimed is:

1. A pulse generator for generating an output pulse of a predetermined pulse width comprising:
    means for generating a first pulse having a pulse width greater than the output pulse;
    means for modifying the first pulse to provide a leading edge of prescribed definition and thereby form a modified first pulse;
    wave guide means for generating a second pulse in response to the modified first pulse, so that the second pulse is formed with a leading edge of the prescribed definition, and for phase shifting the second pulse, so that the phase of the second pulse is opposed to the phase of the modified first pulse;
    means for delaying the second pulse during a period when the second pulse is being phase shifted to oppose the modified first pulse;
    means for combining the delayed opposed phase-shifted second pulse with the modified first pulse so that upon such combining of pulses an output pulse is generated having a pulse width equal to the delay caused by the delaying means.

2. A pulse generator as defined in claim 1 wherein the delaying means is a wave guide.

3. A pulse generator as defined in claim 1 wherein the means for combining the delayed opposed phase-shifted second pulse with the modified first pulse is included in the wave guide means.

4. A pulse generator as defined in claim 1 wherein the modifying means modifies the first pulse to have essentially zero rise time thereby minimizing the effect the leading edge of the first and second pulses have in establishing the pulse width of the output pulse.

5. A pulse generator as defined in claim 4 wherein the modifying means includes:

a circulator; and
    a gas tube coupled to the circulator, the circulator and gas tube modifying the first pulse to have essentially zero rise time.

6. A pulse generator as defined in claim 1 wherein the wave guide means includes:
    a first wave guide for generating the second pulse in response to the modified first pulse and for phase shifting the second pulse relative to the modified first pulse; and
    a second wave guide for further phase shifting the phase-shifted second pulse so that the phase of the phase-shifted second pulse is opposed to the phase of the modified first pulse.

7. A pulse generator as defined in claim 6 wherein the delaying means is coupled between the first and second wave guide.

8. A pulse generator for generating an output pulse of a predetermined pulse width comprising:
    means for generating a first pulse having a pulse width greater than the output pulse;
    means for modifying the first pulse to provide a leading edge of prescribed definition;
    a first wave guide means for generating a second pulse in response to the modified first pulse so that the second pulse is formed with a leading edge of the prescribed definition and for phase shifting the second pulse relative to the modified first pulse;
    means for delaying the phase-shifted second pulse; and
    a second wave guide means for further phase shifting the phase-shifted second pulse, so that the phase thereof is opposed to the phase of the modified first pulse, and for combining the modified first pulse with the delayed opposed phase-shifted second pulse, so that upon combining the modified first pulse with the delayed opposed phase-shifted second pulse an output pulse is generated having a pulse width equal to the delay caused by the delaying means.

9. A pulse generator as defined in claim 8 wherein the modifying means includes:
    a circulator; and
    a gas tube coupled to the circulator, the circulator and gas tube modifying the first pulse to have essentially zero rise time.

10. A pulse generator as defined in claim 8 wherein the first and second wave guide means are quadrature hybrids.

11. A pulse generator as defined in claim 8 wherein the delaying means is a wave guide.

* * * * *